(12) United States Patent
Shafeev et al.

(10) Patent No.: US 6,869,479 B2
(45) Date of Patent: Mar. 22, 2005

(54) METHOD OF LASER-ASSISTED FABRICATION OF OPTOELECTRONIC AND PHOTONIC COMPONENTS

(75) Inventors: George A. Shafeev, Moscow (RU); Sergei G. Krivoshlykov, Shrewsbury, MA (US)

(73) Assignee: Altair Center, LLC, Shrewsbury, MA (US)

(*) Notice: Subject to any disclaimer, the term of this patent is extended or adjusted under 35 U.S.C. 154(b) by 157 days.

(21) Appl. No.: 10/113,123

(22) Filed: Mar. 29, 2002

(65) Prior Publication Data

US 2003/0183152 A1 Oct. 2, 2003

(51) Int. Cl.$^7$ ................................................. C30B 7/00
(52) U.S. Cl. ............................. 117/68; 117/69; 117/84; 117/58; 117/92; 117/944
(58) Field of Search ........................... 117/68, 69, 84, 117/88, 92, 944

(56) References Cited

U.S. PATENT DOCUMENTS 6,068,800 A * 5/2000 Singh et al. .................... 264/8

FOREIGN PATENT DOCUMENTS

| JP | 2000-026120 | * | 1/2000 |
| JP | 2000256863 | * | 9/2000 |
| JP | 2000282244 | * | 10/2000 |
| WO | WO-97/20846 | * | 6/1997 |

* cited by examiner

Primary Examiner—Robert Kunemund

(57) ABSTRACT

The present invention provides a method for fabrication of integrated optical structures and micro-lenses on different substrates based on new process of laser-assisted deposition of optical materials on various crystalline or amorphous solid-state materials. The deposition of target material takes place as a result of interaction of the laser beam with the substrate surface being in direct contact with a liquid containing precursor of appropriate target material. In one preferred embodiment, the micro-lens is fabricated directly on optical fibers or light emitting devices providing improved light collimation as required for efficient laser-to-fiber pig tailing. In another preferred embodiment, the micro-lenses are fabricated on each active element of a laser diode array. The method can be used in all applications where controllable deposition of inorganic or organic materials on a solid state substrate is required, including chemical vapor deposition of thin films, fabrication of integrated optical, fiber-optical and micro-optical components for optoelectronic and photonic devices.

10 Claims, 7 Drawing Sheets

METHOD OF LASER-ASSISTED FABRICATION OF OPTOELECTRONIC AND PHOTONIC COMPONENTS

BACKGROUND OF THE INVENTION

1. Field of the Invention

The present invention relates to laser-assisted fabrication of optoelectronic and photonic components using deposition of optical materials on various crystalline or amorphous solid-state substrates, and, in particular, to a new method of fabrication of self-assembling microstructures, integrated optical structures, and micro-lenses on these substrates. The deposition of target material takes place as a result of interaction of the laser beam with the substrate surface being in direct contact with a liquid containing a precursor of appropriate target material.

In one preferred embodiment, the micro-lens is fabricated directly on optical fibers or light emitting devices providing improved light collimation as required for efficient laser-to-fiber pig tailing. In another preferred embodiment, the micro-lenses are fabricated on each active element of a laser diode array.

The method can be used in all applications where controllable deposition of inorganic or organic materials on a solid state substrate is required, including chemical vapor deposition (CVD) of thin films, fabrication of self-assembling microstructures and integrated optical, fiber-optical, and micro-optical components for optoelectronic and photonic devices.

2. Information Disclosure Statement

Controllable deposition of various materials and thin films on solid-state substrates offers the most efficient and flexible means for fabrication of different optoelectronic and photonic devices. Currently the well-developed technologies of chemical vapor deposition (CVD) or metal-organic chemical vapor deposition (MOCVD) are used for fabrication of thin films of various optical materials, while chemical etching is usually employed for manufacturing of various integrated-optical and shaped micro-optical structures on appropriate solid-state substrates. The mature CVD and MOCVD technologies, however, are rather expensive; they require special clean room facilities and complicated equipment. A flexible method for room temperature deposition of various inorganic or organic target materials onto different solid-state substrates could have dramatic impact on development of the entire optoelectronic and photonic industry.

The proposed invention suggests new approach to fabrication of optielectronic and photonic components. It employs a new method of controllable laser-assisted deposition of the target material from a liquid being in direct contact with the surface of solid-state substrate. "Clean room" in that case is formed inside a gas bubble directly on the interface between the liquid and substrate, while laser beam provides a flexible means for forming required deposition pattern on the substrate surface.

The possibility of laser-assisted deposition of some oxides on sapphire under exposure of its interface with various aqueous solutions has been demonstrated recently [S. I. Dolgaev, V. V. Voronov, and G. A. Shafeev, Heteroepitaxial growth of oxides on sapphire induced by laser radiation in the solid-liquid interface, *Appl. Phys.*, A66, 87–92 (1998)]. The deposition of $Cr_2O_3$, $Fe_2O_3$, and $MnO_2$ has been experimentally observed using aqueous solutions of $CrO_3$, $FeCl_3$, and $KMnO_4$, respectively [V. V. Voronov, S. I. Dolgaev, G. A. Shafeev, Heteroepitaxial growth of films under laser irradiation of the interface sapphire/absorbing liquid, *Reports of Russian Academy of Sciences*, 358(4), 465 (1998); S. I. Dolgaev, N. A. Kirichenko, and G. A. Shafeev, Deposition of nanostructured $Cr_2O_3$ on amorphous substrates under laser irradiation of the solid-liquid interface, *Appl. Surf. Sci.*, 138–139, 449–454 (1999)]. In this instance the deposited oxide film grows epitaxially on the sapphire. On the contrary, in the case of an amorphous transparent solid, e.g., glass, the deposit is amorphous and is made of nanoclusters of the corresponding oxide. Similar results have been reported later on deposition of an amorphous $TiO_2$ on a glass substrate under laser irradiation of an aqueous solution of $TiCl_3$ [G. A. Shafeev. Dynamics of $TiO_2$ deposition from $TiCl_3$ aqueous solution induced by a cw laser radiation, *Physics of Vibrations*, 7, 197 (1999)].

Based on these recent findings, the present invention proposes general method of laser-assisted fabrication of different micro-optical optoelectronic and photonic components using deposition of target inorganic or organic materials from a liquid onto various solid-state substrates. In one preferred embodiment, the material deposition process is used to form a micro-lens directly on optical fiber end face or on its side surface. Such a micro-lens can dramatically improve efficiency of coupling of various lasers, including laser diodes, into the optical fiber. The micro-lens can also be fabricated directly on light emitting devices, such as laser diodes or laser diode arrays, performing beam-collimating functions as required for fabrication of different fiber-optic components. In another preferred embodiment the material deposition process is used for fabrication of various integrated optical components on different substrates, including waveguides, gratings and micro-optical elements. The process provides a possibility of simple fabrication of many different active and passive micro-optical elements employing the simple procedure of direct laser beam writing of the required structure.

The proposed general method can be applied to fabrication of many different inorganic or organic micro-optical components and devices onto various amorphous and crystalline solid-state substrates.

OBJECTS AND SUMMARY OF THE INVENTION

It is an object of the present invention to provide a method of laser-assisted high-rate deposition of large variety of optical materials via localized decomposition of a liquid-phase precursor, being in contact with a solid substrate.

Another object of the invention is to dramatically reduce cost of the process by eliminating the need of expensive using clean room facilities and creating the "clean room" conditions inside a gas bubble which position could be efficiently controlled by the laser beam for selective deposition of the target material.

Further object of the invention is to describe a method for fabrication of various integrated-optical structures, such as waveguides, gratings, directional couplers, micro-lenses, microring resonators, on various substrates using the laser-assisted technique of selective deposition of target materials.

Another object is to provide an efficient method for fabrication of diffraction gratings and other periodic structures on the surface of waveguides and optical substrates.

Another object of the invention is to provide an effective technology for developing silicon based integrated optics.

Sill another object of the invention is to provide a means of forming a micro-lens directly of the fiber end face for efficient coupling of the optical radiation into fibers and waveguides.

A further object is to improve the coupling of radiation of diode lasers into optical fibers via appropriate shaping of the deposited micro-lens.

An additional object of the invention is to provide means for fabrication of the light collimating micro-lenses directly on the end face of semiconductor light emitting devices, such as laser diodes, bars and arrays.

Briefly stated, the present invention provides a method of laser-assisted fabrication of various micro-optical components for optoelectronic and photonic applications using deposition of inorganic or organic target material on the surface of a solid state substrate, including both amorphous and crystalline, semiconductor, dielectric or metal substrates.

In one preferred embodiment, the material deposition process is used to form a micro-lens directly on optical fiber end face or on its side surface. Such a micro-lens can dramatically improve efficiency of coupling of various lasers, including laser diodes, into the optical fiber. The micro-lens can also be fabricated directly on light emitting devices, such as laser diodes or laser diode arrays, performing beam-collimating functions as required for fabrication of different fiber-optic components. In another preferred embodiment the material deposition process is used for fabrication of various integrated optical components on different substrates, including waveguides, gratings and micro-optical elements. The process provides a possibility of simple fabrication of many different active and passive micro-optical elements employing the simple procedure of direct laser beam writing of the required structure.

The method can be used in all applications where fabrication of various inorganic or organic micro-optical components and devices onto different amorphous and crystalline solid-state substrates is required, including various optoelectronic and photonic devices.

The above, and other objects, features and advantages of the present invitation will become apparent from the following description read in conjunction with the accompanying drawings.

DESCRIPTION OF PREFERRED EMBODIMENTS

The proposed new method of laser-assisted fabrication of various optoelectronic and photonic components employs the phenomena of deposition of appropriate solid materials from a liquid. Exposure of the interface between solid-state substrate and liquid containing a precursor of appropriate target material can lead to formation of a deposit on the target material on the surface of solid state substrate due to chemical reaction induced by laser radiation in the liquid. The key feature of this process is the way of the beam delivery to the interface. If liquid is not transparent for laser radiation, then direct focusing through the liquid is impossible because it absorbs the laser beam. In this case, the only way to irradiate the interface is its exposure through the transparent solid. This optical scheme is used for localized etching of dielectrics transparent to laser radiation and is called "backside etching technique". As opposed to this process, the deposition may take place if the absorbing liquid undergoes chemical changes under laser exposure resulting in formation of a product that is not soluble in the initial liquid. These changes can be due to either photo- or thermochemical reaction induced in the liquid. The similar process can take place in the case when liquid in transparent for laser radiation, while the solid-state substrate absorbs the light.

Figure 1:
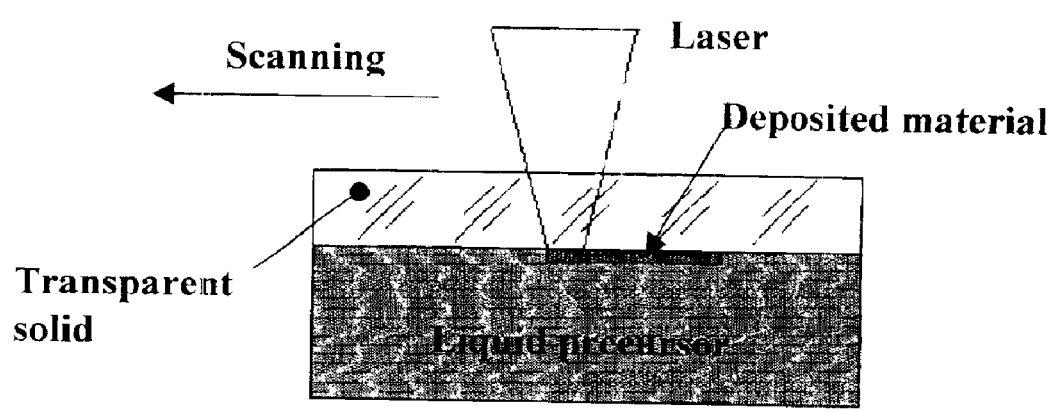
FIG. 1 schematically illustrates a laser-assisted process of deposition of target materials from a liquid containing an appropriate precursor. The deposited integrated-optical structure is obtained by scanning the laser beam along the solid-liquid interface.

Laser heating of the liquid under atmospheric pressure frequently leads to local temperature rise exceeding the boiling point of the liquid. If the beam waist is located in the liquid, the periodic generation of gas bubbles tales place. Under tough focusing on the interface, the gas bubble appears at the solid-liquid interface following the laser spot upon scanning the solid-liquid interface. Hence, synthesis of the deposit target material takes place into a vapor-filled bubble attached to the solid and forming a miniature "clean room". The process of chemical vapor deposition of target material from a liquid onto surface of a solid-state substrate is shown in FIG. 1.

Thus the proposed new technology employs the process of self-organization due to feedback between the intensity of the laser beam and the rate of a chemical reaction induced by this beam in the surrounding medium. The rate of laser-induced reaction is proportional to local intensity of a laser beam. The specific range of operation wavelengths implies certain choice of an appropriate chemical environment. First, the chemically active medium generally should not be in a gaseous phase, since the rate of deposition would be too low. Therefore, the choice is limited to liquid-phase chemical reactions. Second, the product of the laser-induced reaction should be transparent for the laser beam inducing the reaction; otherwise the lens would have high losses at the laser wavelength. At the same time, the medium containing the precursor should absorb laser irradiation sufficiently well in order to start the reaction. Third, the reaction product should be insoluble in the surrounding liquid medium. These three requirements define the choice of appropriate chemical environment for fabrication of self-assembling components.

The proposed method is quite general allowing wide choice of materials for deposition on specific substrate. One can deposit various inorganic or organic target material on the surface of different solid state substrate, including both amorphous and crystalline, semiconductor, dielectric or metal substrates, such as glass, fused silica, silicon, sapphire, GaAs, InP, GaN, CdS, CdSe, ZnSe, etc. The target material can be an epitaxial film or aggregates of such materials as $Cr_2O_3$, $TiO_2$, $Al_2O_3$, $MnO_2$, $Fe_2O_3$, diamond, polystyrene, polyamide, polyacetylene, porphyrins, MEH-PPV, etc. The deposition process is continued until achieving such thickness and shape of said epitaxial films or aggregates as required for fabrication of specific components.

Generally, one can apply the proposed method to any light-sensitive chemical reaction in the liquid or even in gaseous phase, including the reaction of polymerization. Depending on the precursor, the deposit may consist of crystalline, polycrystalline, nanocrystalline, and amorphous material. A wide class of polymers can be deposited via laser initiation of the polymerization in liquid phase, e.g., polystyrene, polyamide, polyacetylene, porphyrins, MEH-PPV.

Figure 2:
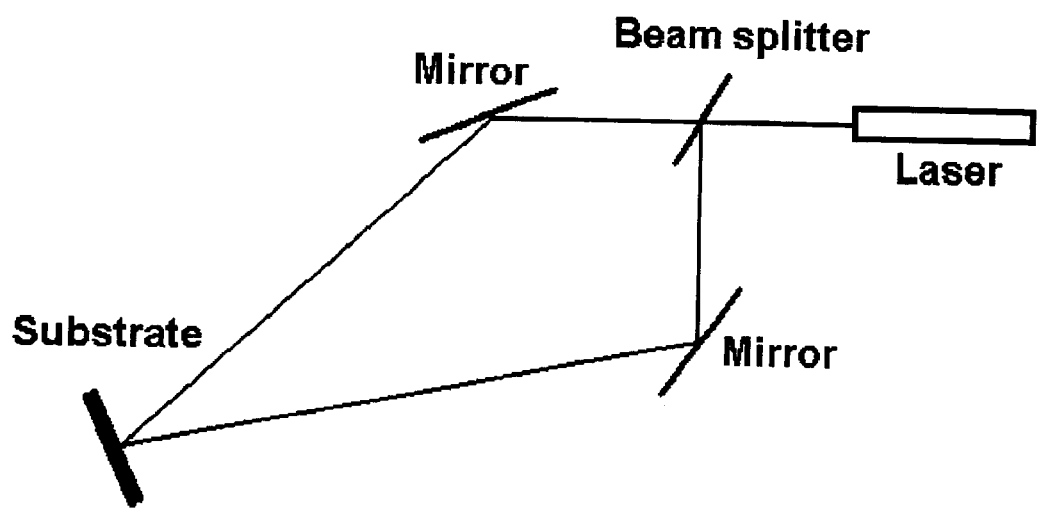
FIG. 2 shows schematic of setup for fabrication of diffractive gratings and other periodic structures.

In one preferred embodiment the setup shown in FIG. 1 is used for fabrication of various optoelectronic and photonic components on appropriate substrates, such as integrated optical waveguides, diffractive gratings, micro-ring resonators, directional couplers, micro-lenses, etc. For example, the proposed technology allows simple fabrication of diamond integrated optical waveguides and components on silicon substrates. The laser beam is focused through a transparent substrate onto a liquid-substrate interface. The required integrated-optical structure is pictured by scanning of the focused laser beam along the substrate. The diffractive gratings or other periodic structures can be fabricated by projecting an interference pattern of two tilted laser beams onto the substrate as shown in FIG. 2. The gratings can be fabricated either directly on the substrate, or on the surface of integrated optical waveguides. Period of the grating can be adjusted by changing angle between the interfering beams.

In another embodiment an optical fiber having optional means of focusing of the laser beam is used as a means of delivery of the laser beam to absorbing surface of solid-state material, while liquid with target material is selected to be sufficiently transparent at the wavelength of laser operation.

Figure 3:
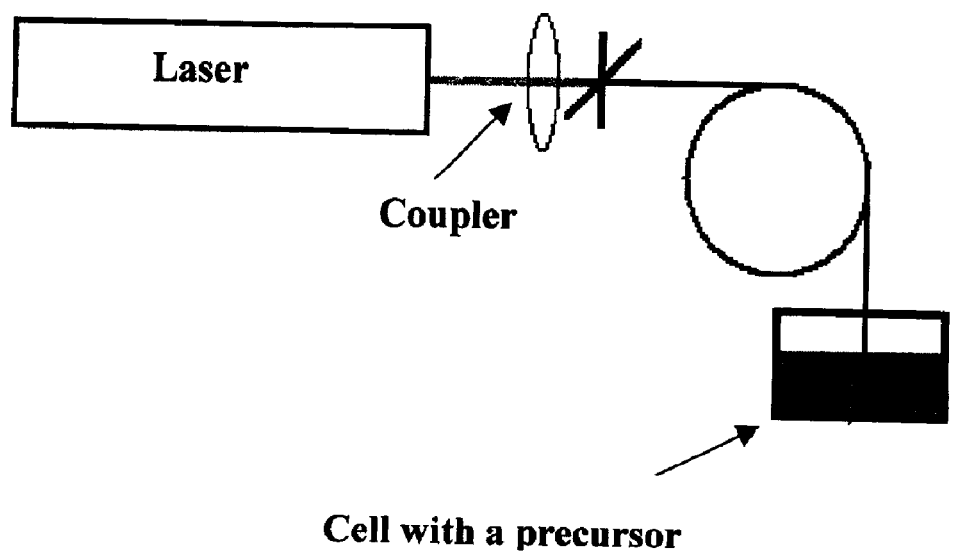
FIG. 3 shows a process of fabrication of a micro-lens directly on the core of an optical fiber. The radiation of a laser is coupled into the fiber, whose output end is dipped into the liquid precursor.

In the preferred embodiment shown in FIG. 3 the laser radiation is delivered to an absorbing liquid through an optical fiber and deposition of the corresponding target material from the liquid takes place directly on the fiber core. Geometry of the deposited target material basically repeats configuration of the vapor bubble and its position is determined by distribution of the laser beam intensity. If the beam intensity distribution is a Gaussian-like (e.g., in the case of a single-mode fiber), then the deposit has maximal thickness on the axis of the laser beam. The deposit thickness decreases to the periphery of the beam, resulting thus in the formation of a plane-convex lens directly attached to the fiber core. In this sense this lens can be considered as the self-assembled one. The fabrication of self-assembled micro-optical elements on the core of tapered fiber may be used, for example, for manufacturing of fiber tips for Near-Field Scanning Optical Microscopy (NSOM) or in confocal microscopy employing miniature focusing fiber tips.

Focusing of optical radiation for its coupling into optical fibers is important for design of various optical components, interconnectors, optical fiber communication systems, fiber-optic sensors and high-power fiber-pigtailed laser diodes. Typically the divergence of the output radiation from a laser source is much higher than the numerical aperture of an optical fiber. This mismatching of numerical apertures results in serious power losses in coupling of the laser sources into optical fibers. The most serious problem appears is coupling of laser diodes into optical fibers. The laser diode emits radiation that has different divergences in two perpendicular directions due to stripe shape of its emission area. New methods of efficient laser-to-fiber coupling are of great importance for all applications where optical fibers are involved.

There are several methods for fabrication of micro-lenses directly of optical fiber, such as direct attaching of a micro-lens to the fiber end face, using cylindrical micro-lens between the fiber and diode laser, shaping the fiber end face using polishing technique, tapering the fiber end. All these methods have common alignment problem: due to small diameter of the fiber core it is very difficult to ensure correct position of the micro-lens exactly to the optical axis of the fiber.

The embodiment of present invention shown in FIG. 3 offers a new method for fabrication of a micro-lens directly on the core of an optical fiber employing a simple and efficient self-organization process of the lens formation based on laser-induced Chemical Vapor Deposition (CVD) in liquid phase. During this process the micro-lens is automatically created as a result of a light-assisted chemical reaction in a liquid medium surrounding the fiber end. Because the light delivered through the fiber initiates deposition of the lens material, formation of the micro-lens takes place exactly on the fiber core. Geometrical parameters of the micro-lens can be easily controlled via proper choice of the regime of processing, such as the laser intensity coupled into the fiber, deposition time, and the concentration of chemical species. The formation of the self-assembled micro-lens is extremely simple and cost-effective process. It can be carried out at room temperature and does not require any vacuum equipment or special clean room facilities. It is much faster than conventional gas-phase CVD process.

Figure 4:
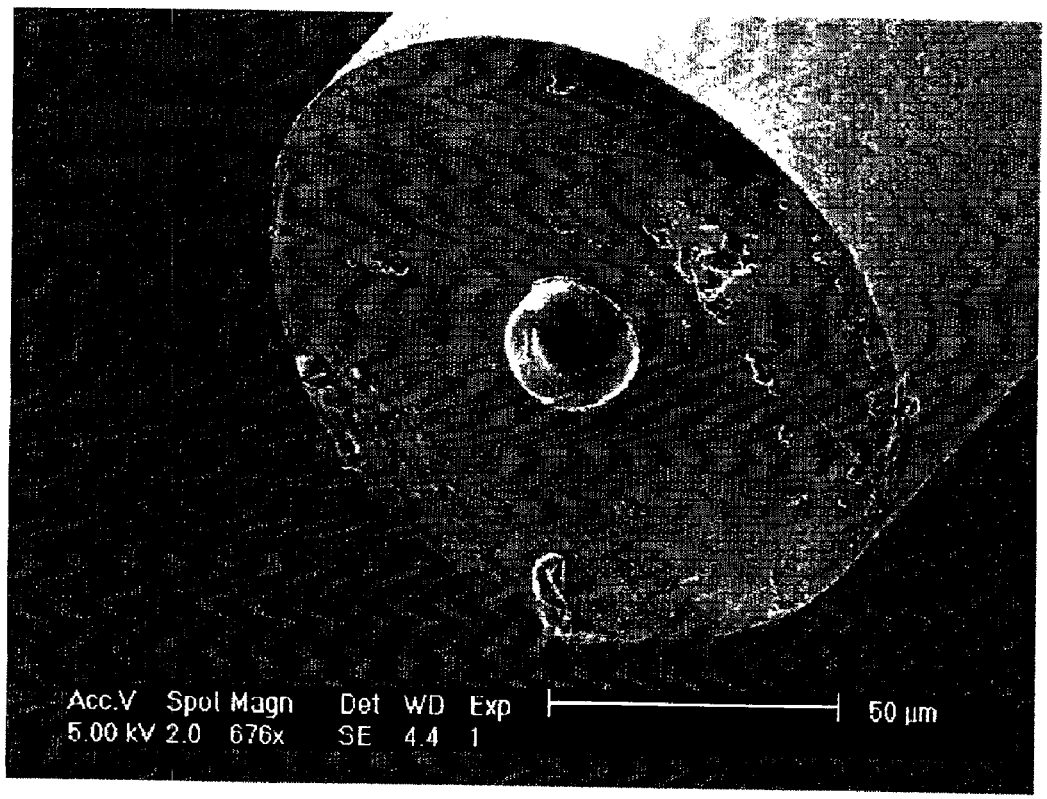
FIG. 4. Shows picture of self-assembled $TiO_2$ lens on the multimode fiber using aqueous solution of $TiCl_3$ as precursor and CW Ar-ion laser beam at wavelength of 514 nm.

FIG. 4 shows an example of such self-assembled $TiO_2$ lens fabricated by dipping a multimode optical fiber into the aqueous solution of $TiCl_3$. The fiber has been excited with Ar-ion laser beam at wavelength of 514 nm. Typical time of formation of the self-assembled lens was several seconds, depending on the absorption coefficient of the solution, average laser power, core diameter, etc.

Figure 5:
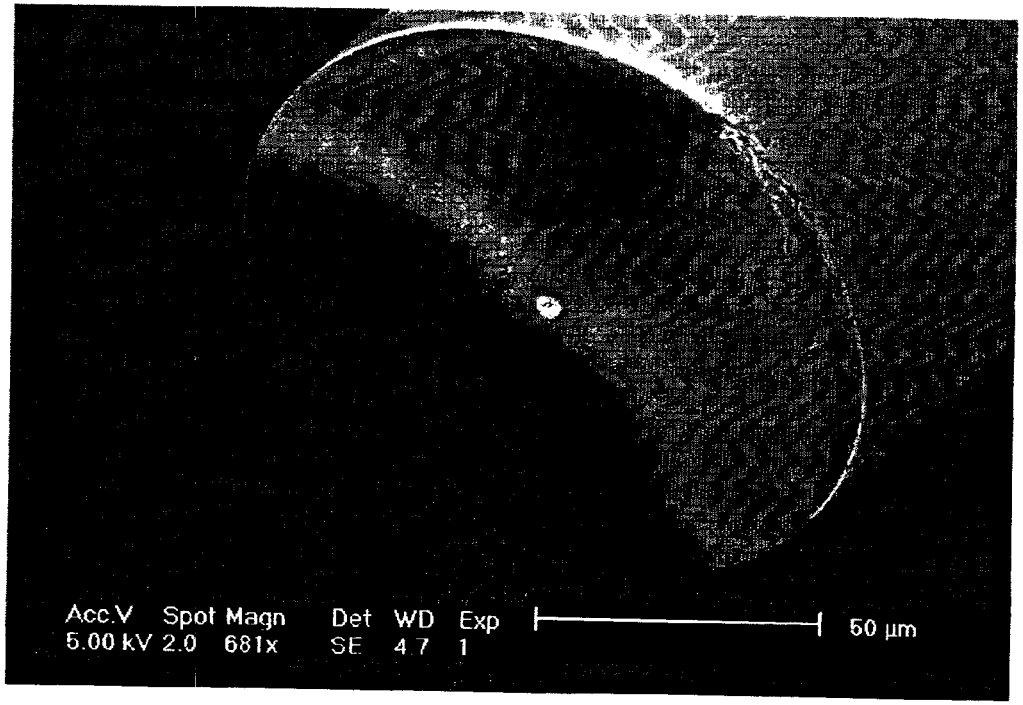
FIG. 5. Shows self-assembled $Cr_2O_3$ lens on a single-mode fiber using aqueous solution of $CrO_3$ as precursor and $TEM_{00}$ CW Ar-ion laser beam at wavelength of 514 nm.

FIG. 5 shows picture of the self-assembled $Cr_2O_3$ lens fabricated on a single-mode fiber by dipping the fiber into the aqueous solution of $CrO_3$. Some distortion of the fiber image is due to charging of the fiber under electron beam of the Scanning Electron Microscope. It has nothing to do with the actual shape of the fiber, which is cylindrical.

Figure 6:
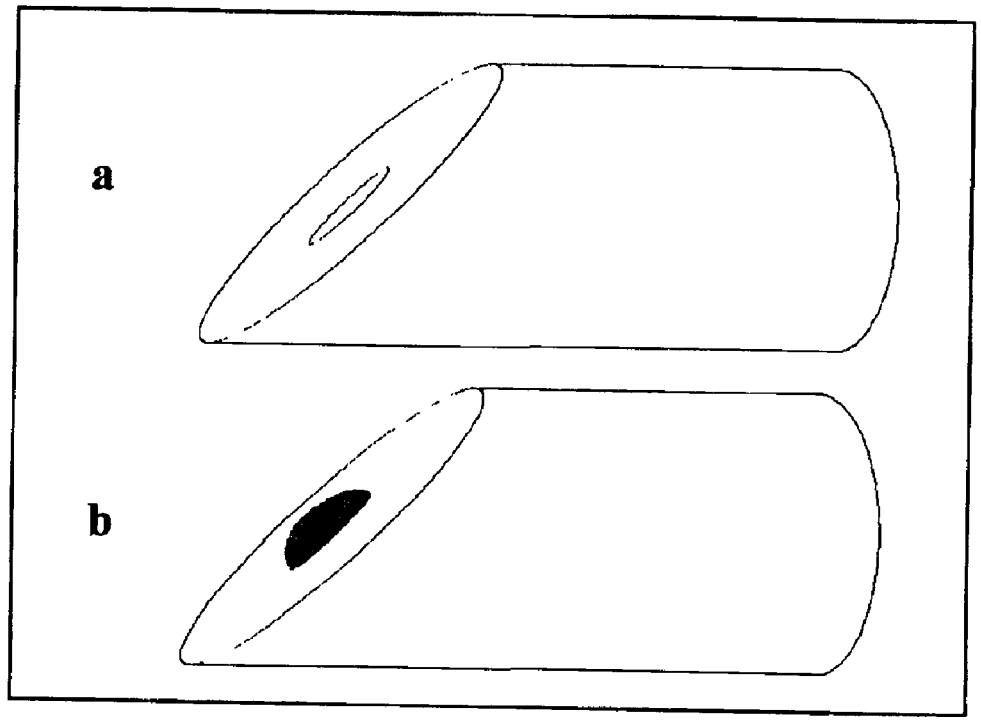
FIG. 6 shows an inclined cut of the fiber (a) and a deposited elongated micro-lens (b).

In one preferred embodiment shown in FIG. 6a the optical fiber is cleaved under some angle to its axis. As a result, the cross section of the fiber core has an elliptical shape. Upon dipping this end of the fiber into a liquid precursor the deposited micro-lens will also have an elongated shape, as shown in FIG. 6b. Because emitting area of a laser diode also has elongated shape this asymmetric micro-lens can improve coupling of the radiation of the laser diode into the fiber. Deposition of an elongated lens on the fiber end face cleaved under appropriate angle ensuring total internal reflection can also be used for fabrication of side focusing optical fiber tips for medical applications such as laser therapy and surgery.

In another embodiment the proposed method is used for deposition of organic or inorganic target materials and fabrication of micro-lenses structures of side surface of optical fibers. The deposition of target material takes place in the regions where the laser light exits the fiber core interacting with the fiber surface immersed in liquid. This can be achieved in side-polished fiber in the regions where the fiber cladding is removed to expose the fiber core. Another useful configuration where the laser light leaves the core interacting with the surface of fiber cladding is U-bent fiber. Due to sharp bending of the multimode fiber having radius of bending of about 1–2 mm the light escapes from the fiber core into its low-index cladding. After Fresnel reflection at the interface between the cladding and liquid with lower refractive index, almost 80% of the light returns back into the fiber core. If the bent region of the fiber is immersed into liquid having appropriate precursor, then the target material will be deposited in the region of U-bending forming ether a thin film or a micro-lens depending of time and regime of processing.

Figure 7:
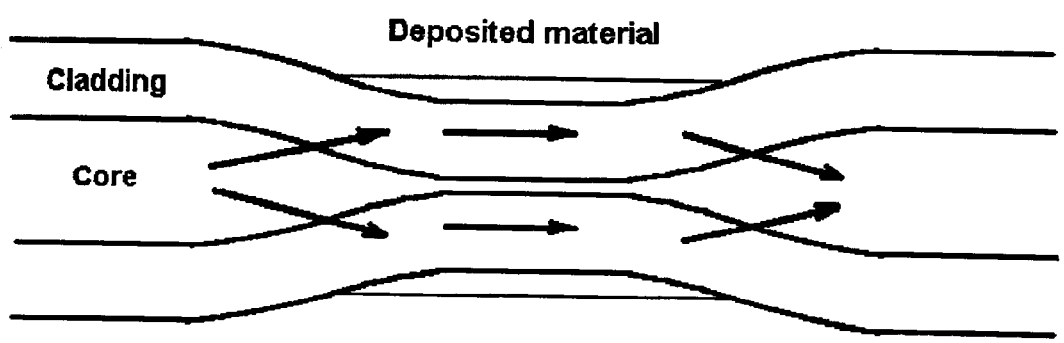
FIG. 7 shows a double tapered fiber with target material deposited on its surface.

A fiber having double taper shown in FIG. 7 can also be used for deposition of the target material onto the fiber cladding. It is known that as the fiber diameter decreases the light escapes from the fiber core and propagates in its cladding. The cladding guides the light due to total internal reflection at the cladding-liquid interface if refractive index of the liquid is lower than that of the cladding. At the second taper, where the fiber diameter increases, the light couples back into the fiber core. In the case of the double taper configuration the region of the fiber where target material is deposited can be either small enough for fabrication of a micro-lens of the fiber surface, or it may approach many centimeters.

In one of the most important embodiments the proposed technology is used for fabrication of micro-lenses directly onto end faces of semiconductor light emitting devices, such as light emitting diodes, laser diodes, laser diode bars or arrays, including vertical cavity surface emitting lasers (VCSELs). In that case the end face of the semiconductor light emitting device is brought into contact with a liquid having appropriate precursor of target material, and the micro-lens formation directly onto end face of the light emitting device is supported by the light generated by this device. In one preferred embodiment, the self-assembled micro-lenses are fabricated on each active element of a laser diode array. This technique can be used for fabrication of new class of semiconductor light-emitting devices generation highly collimated beam, as required for efficient coupling of the light beam into optical fibers, fiber bundles, and other applications.

It should be noted, that the proposed technology does not require dipping of the entire light-emitting device into liquid. Only output face of the device should be in a direct contact with the liquid. This could be achieved by attaching just one drop of the liquid to the end face of the device, which is usually much smaller than the drop size. The drop of most liquids, including water, will be held on the device end face by forces of surface tension.

Having described preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A method of laser-assisted fabrication of microstructured optoelectronic and photonic components using deposition of inorganic or organic target materials, such as $Cr_2O_3$, $TiO_2$, $Al_2O_3$, $MnO_2$, $Fe_2O_3$, diamond, polystyrene, polyamide, polyacetylene, porphyrins, MEH-PPV, forming the microstructure with required refractive index, relief, shape, waveguiding or light focusing properties on the surface of a solid state substrate, including both amorphous and crystalline, semiconductor, dielectric or metal substrates, such as glass, fused silica, silicon, sapphire, GaAs, InP, GaN, CdS, CdSe, ZnSe, comprising the steps of
immersing the surface of said substrate into at least one liquid having an appropriate precursor of said target material,
irradiating the surface of said solid state substrate with a CW or pulsed laser beam at the wavelength of operation corresponding to the spectral region of absorption either in the solid state substrate or liquid, tightly focused to the microscopic region of material deposition to selectively hear the microscopic region and create a gas bubble in said liquid forming a microscopic clean room for deposition of said target material,
continuing the process until said target material forms the microstructure with required relief and shape onto the surface of said solid state substrate,
removing surface of said solid state substrate from said liquid,
wherein either said solid state substrate material or liquid should remain sufficiently transparent for laser beam at the wavelength of operation allowing irradiation of said surface of solid state substrate, or other means of delivery of the laser beam to said surface of solid state substrate is used.

2. A method of laser-assisted fabrication of optoelectronic and photonic components using deposition of inorganic or organic target material on the surface of a solid state substrate of claim 1, wherein said tightly focused laser beam is scanned along said solid state substrate to form various integrated-optical structures with required relief and shape on the surface of said substrate from said inorganic or organic target material, including integrated-optical waveguide structures, directional couplers, micro-ring cavities, wavelength division multiplexing components, and micro-lens arrays.

3. A method of laser-assisted fabrication of optoelectronic and photonic components using deposition of inorganic or organic target material on the surface of a solid state substrate of claim 2, wherein said solid state substrate is made from silicon crystal and said integrated-optical structure is formed from diamond material as required for silicon-based integrated optics.

4. A method of laser-assisted fabrication of optoelectronic and photonic components using deposition of inorganic or organic target material on the surface of a solid state substrate of claim 1, wherein surface of said solid state substrate is irradiated with two mutually coherent laser beams crossing under some angle and forming a diffraction grating or other periodic structure from said target material which period can be adjusted by changing the angle between the laser beams.

5. A method of laser-assisted fabrication of optoelectronic and photonic components using deposition of inorganic or organic target material on the surface of a solid state substrate of claim 1, wherein an optical fiber having optional means of focusing of said laser beam is used as said means of delivery of the laser beam to said surface of solid state material.

6. A method of laser-assisted fabrication of optoelectronic and photonic components using deposition of inorganic or organic target material on the surface of a solid state substrate of claim 1, wherein said surface of the solid state substrate is end face of the fiber delivering said laser beam, side-polished surface of the fiber, surface of U-bent fiber, or tapered region of the fiber ensuring access of the laser beam to said surface of solid state substrate and said target inorganic or organic material is deposited onto said end face, side-polished surface, fiber cladding in the region of U-bend, or fiber cladding in tapered region of the fiber.

7. A method of laser-assisted fabrication of optoelectronic and photonic components using deposition of inorganic or organic target material on the surface of a solid state substrate of claim 6, wherein said deposition process is continued until said target inorganic or organic material forms a micro-lens on said end face of the fiber, side-polished surface of the fiber, fiber cladding in the region of U-bend, or fiber cladding in tapered region of the fiber ensuring efficient coupling of light into the fiber or out the fiber.

8. A method of laser-assisted fabrication of optoelectronic and photonic components using deposition of inorganic or organic target material on the surface of a solid state substrate of claim 7, wherein said end face of the fiber is cleaved or polished at some angle to its axis and said deposition process is continued until said target inorganic or organic material forms an asymmetric micro-lens on said fiber end face.

9. A method of laser-assisted fabrication of optoelectronic and photonic components using deposition of inorganic or organic target material on the surface of a solid state substrate of claim 1, wherein said surface of the solid state substrate is end face of semiconductor light emitting device, such as light emitting diode, laser diode, laser diode bar or array, including vertical cavity surface emitting lasers (VCSELs), and said deposition process is continued until said target inorganic or organic material forms at least one micro-lens on said end face of the semiconductor light emitting device ensuring efficient collimation of the light generated by said semiconductor light emitting device and coupling it into an optical fiber or into a bundle of optical fibers.

10. A method of laser-assisted fabrication of optoelectronic and photonic components using deposition of inorganic or organic target material on the surface of a solid state substrate of claim 9, wherein at least one drop of said liquid is brought into direct contact with said end face of light emitting device being held in contact with the end face by forces of surface tension.

* * * * *